United States Patent
Karda et al.

(10) Patent No.: US 11,222,690 B2
(45) Date of Patent: *Jan. 11, 2022

(54) VERTICAL 3D SINGLE WORD LINE GAIN CELL WITH SHARED READ/WRITE BIT LINE

(71) Applicant: Micron Technology, Inc., Boise, ID (US)

(72) Inventors: Kamal M. Karda, Boise, ID (US); Haitao Liu, Boise, ID (US); Karthik Sarpatwari, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/725,261

(22) Filed: Dec. 23, 2019

(65) Prior Publication Data

US 2020/0211631 A1 Jul. 2, 2020

Related U.S. Application Data

(60) Provisional application No. 62/785,159, filed on Dec. 26, 2018.

(51) Int. Cl.
*G11C 7/00* (2006.01)
*G11C 11/4097* (2006.01)
(Continued)

(52) U.S. Cl.
CPC ...... *G11C 11/4097* (2013.01); *G11C 11/4094* (2013.01); *G11C 11/4096* (2013.01); *H01L 27/10844* (2013.01); *H01L 27/10897* (2013.01)

(58) Field of Classification Search
CPC . G11C 16/0433; G11C 16/0416; G11C 16/10; G11C 16/08; G11C 8/10;
(Continued)

(56) References Cited

U.S. PATENT DOCUMENTS

| | | |
|---|---|---|
| 6,396,745 B1 | 5/2002 | Hong et al. |
| 6,757,196 B1 | 6/2004 | Tsao et al. |

(Continued)

FOREIGN PATENT DOCUMENTS

WO 2020139833 7/2020

OTHER PUBLICATIONS

"International Application Serial No. PCT US2019 068341, International Search Report dated Apr. 29, 2020", 3 pgs.
(Continued)

*Primary Examiner* — Hien N Nguyen
(74) *Attorney, Agent, or Firm* — Schwegman Lundberg & Woessner, P.A.

(57) ABSTRACT

Some embodiments include apparatuses and methods of forming the apparatuses. One of the apparatuses includes multiple levels of two-transistor (2T) memory cells vertically arranged above a substrate. Each 2T memory cell includes a charge storage transistor having a gate, a write transistor having a gate, a vertically extending access line, and a single bit line pair. The source or drain region of the write transistor is directly coupled to a charge storage structure of the charge storage transistor. The vertically extending access line is coupled to gates of both the charge storage transistor and the write transistor of 2T memory cells in multiple respective levels of the multiple vertically arranged levels. The vertically extending access line and the single bit line pair are used for both write operations and read operations of each of the 2T memory cells to which they are coupled.

11 Claims, 11 Drawing Sheets

(51) Int. Cl.
*G11C 11/4096* (2006.01)
*H01L 27/108* (2006.01)
*G11C 11/4094* (2006.01)

(58) Field of Classification Search
CPC ... G11C 16/0425; G11C 16/0483; G11C 5/04; G11C 16/26
See application file for complete search history.

(56) References Cited

U.S. PATENT DOCUMENTS

| | | |
|---|---|---|
| 2004/0120188 A1 | 6/2004 | Chih |
| 2013/0077397 A1 | 3/2013 | Kurita et al. |
| 2018/0061834 A1 | 3/2018 | Derner et al. |
| 2020/0211629 A1* | 7/2020 | Karda ................. G11C 11/4096 |

OTHER PUBLICATIONS

"International Application Serial No. PCT US2019 068341, Written Opinion dated Apr. 29, 2020", 4 pgs.

* cited by examiner

VERTICAL 3D SINGLE WORD LINE GAIN CELL WITH SHARED READ/WRITE BIT LINE

PRIORITY APPLICATION

This application claims the benefit of priority to U.S. Provisional Application Ser. No. 62/785,159, filed Dec. 26, 2018, which is incorporated herein by reference in its entirety.

BACKGROUND

Memory devices are widely used in computers and many other electronic items to store information. Memory devices are generally categorized into two types: volatile memory device and non-volatile memory device. An example of a volatile memory device includes a dynamic random-access memory (DRAM) device. An example of a non-volatile memory device includes a flash memory device (e.g., a flash memory stick). A memory device usually has numerous memory cells to store information. In a volatile memory device, information stored in the memory cells are lost if supply power is disconnected from the memory device. In a non-volatile memory device, information stored in the memory cells are retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

BRIEF DESCRIPTION OF THE DRAWINGS

FIGS. 6-12 show processes of forming a memory device, according to some embodiments described herein.

DETAILED DESCRIPTION

The memory device described herein includes volatile memory cells having a charge storage node (e.g., structure) that can be a floating gate structure). Each of the described memory cells can include two transistors (2T memory cell). One of the two transistors is a charge storage transistor having the charge storage structure of the memory cell (such as, for example, a floating gate of a floating gate memory cell, or a charge trap structure of a charge trap memory cell). The memory device described herein can have structure that allows the size of the memory device to be relatively smaller than the size of similar conventional memory devices, such that Information can be stored in a storage node of the memory cell. Different variations of the described memory device are discussed in detail below with reference to FIG. 1 through FIG. 12.

Figure 1:
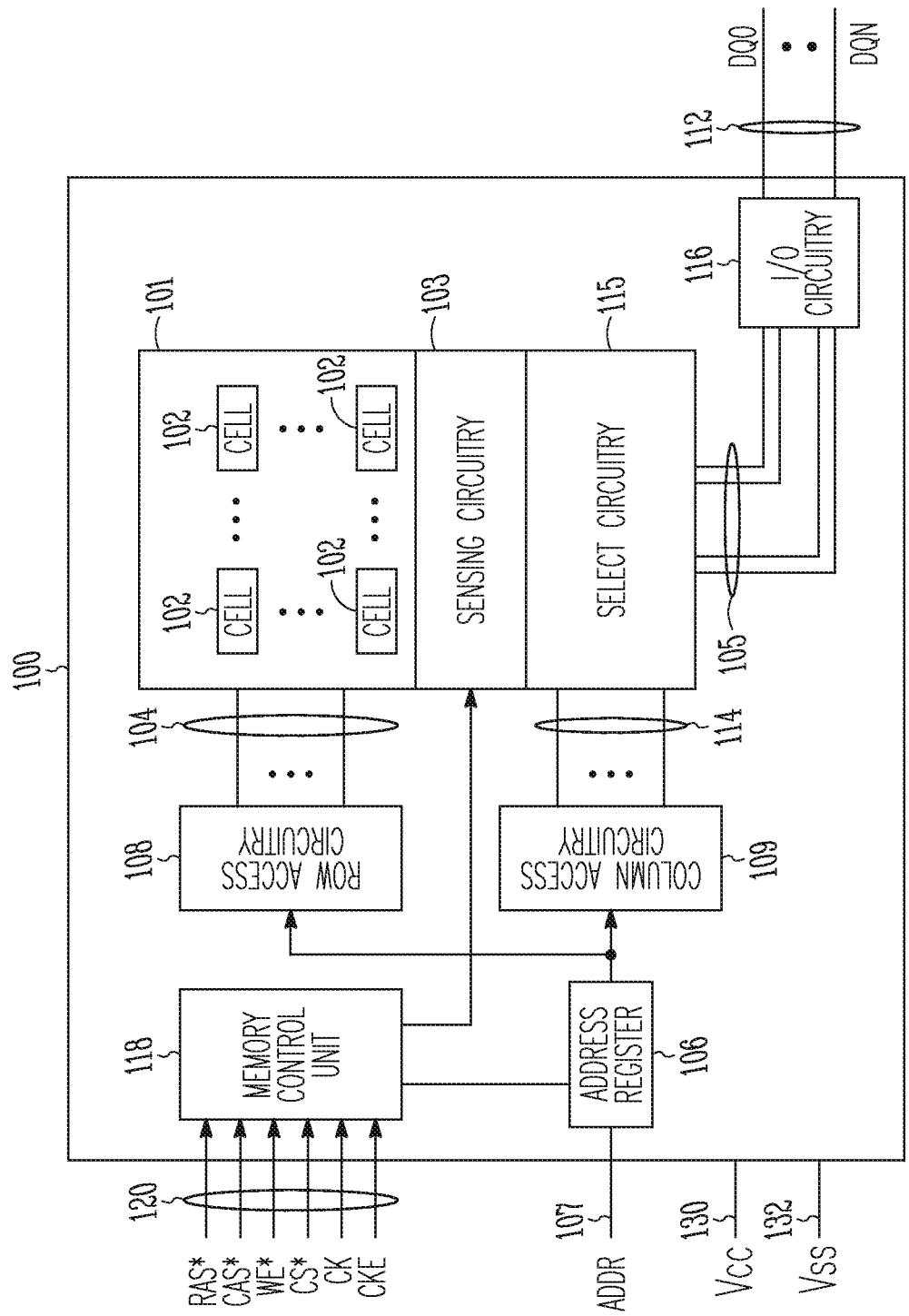
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 is volatile memory device (e.g., a DRAM device), such that memory cells 102 are volatile memory cells. Thus, information stored in memory cells 102 may be lost (e.g., invalid) if supply, power (e.g., supply voltage Vcc) is disconnected from memory device 100. Hereinafter, Vcc is referred to represent some voltage levels, however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on Vcc, such an internal voltage may be used instead of Vcc.

In a physical structure of memory device 100, memory cells 102 can be formed vertically (e.g., stacked over each other in different layers) in different levels over a substrate (e.g., semiconductor substrate) of memory device 100. The structure of memory array 101 including memory cells 102 can include the structure of memory arrays and memory cells described below with reference to FIG. 2 through FIG. 6.

As shown in FIG. 1, memory device 100 can include access lines 104 (or "word lines") and data lines (or "bit lines") 105. Memory device 100 can use signals word line signals) on access lines 104 to access memory cells 102 and data lines 105 to provide information (e.g., data) to be stored in (e.g., written) or sensed (e.g., read) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single hit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118 to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., logic 0 and logic 1) of information (read from memory cells 102) provided to lines 112 (in the form signals DQ0 through DQN) can be based on the values of signals $DL_0$ and $DL_0$* through $DL_N$ and $DL_N$* on data lines 105. In a write operation, the value (e.g., "0" (binary 0) or "1" (binary 1)) of the information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a memory controller or a processor) can communicate with memory device 100 through lines 107, 112, and 120.

Memory device 100 may include other components, which are not shown to help focus on the embodiments described herein. Memory device 100 can be configured to include at least a portion of the memory device with associated structures and operations described below with reference to FIG. 2 through FIG. 6.

One of ordinary skill in the art may recognize, upon reading this description, that memory device 100 may include other components, several of which are not shown in FIG. 1 so as not to obscure the example embodiments described herein. At least a portion of memory device 100 (e.g., a portion of memory array 101) can include structures similar to or identical to any of the memory devices described below with reference to FIGS. 2-6.

Figure 2:
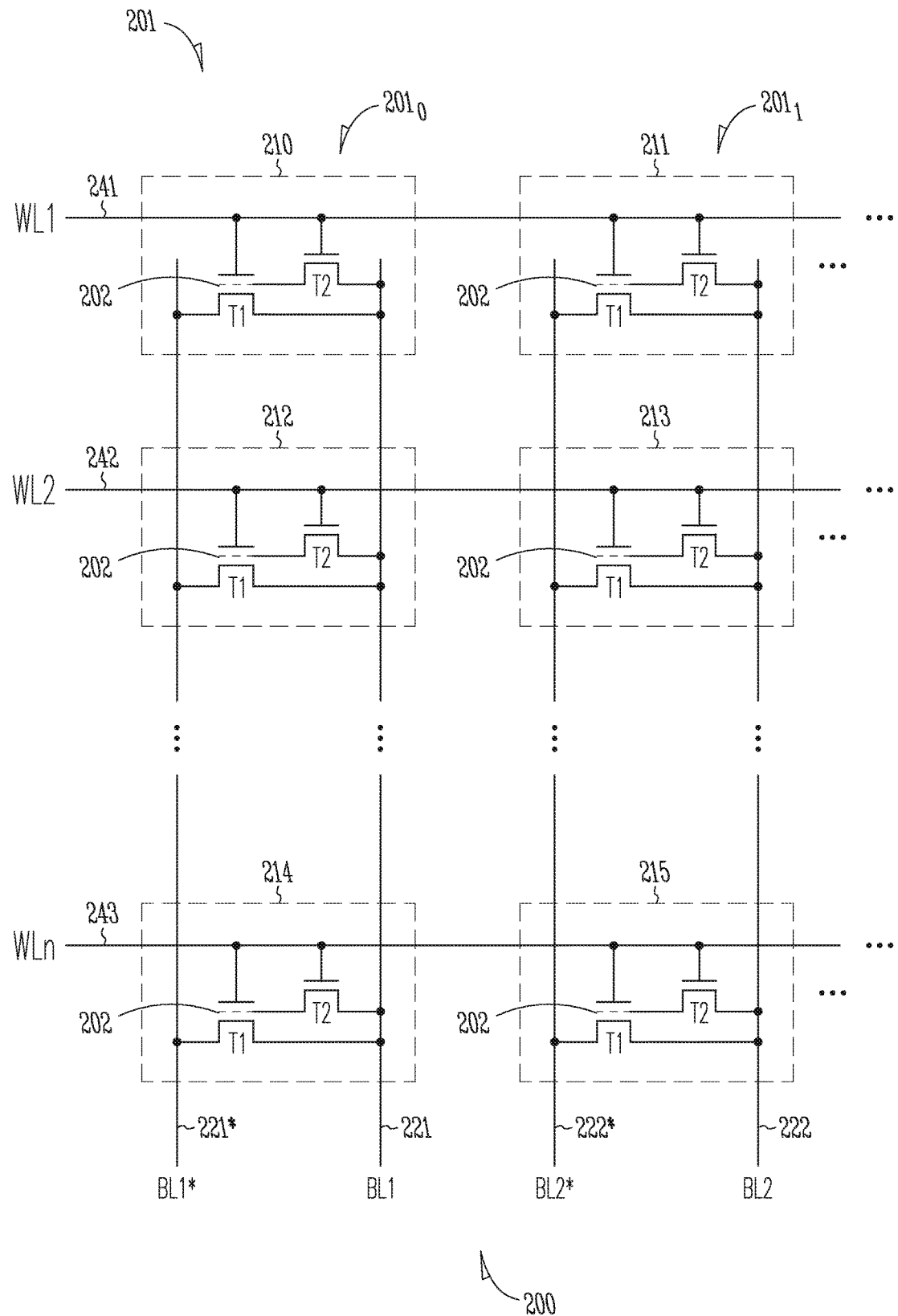
FIG. 2 shows a schematic diagram of a portion of a memory device including a memory array, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T (two-transistor) memory cell. Each of transistors T1 and T2 can include a field-effect transistor (FET). Transistor T1 can include a floating-gate based transistor. Each of memory cells 210 through 215 can include a charge storage node 202, which can include the floating gate (e.g., floating gate 202) of transistor T1. Charge storage node 202 can store charge. Charge storage node 202 is the memory element of a respective memory cell among memory cells 210 through 215. The value (e.g., "0" or "1") of information stored in a particular memory cell among memory cells 210 through 215 can be based on the amount of charge in charge storage node 202 of that particular memory cell. As shown in FIG. 2, a non-gate terminal (e.g., source or drain) of transistor T2 of a particular memory cell among memory cells 210 through 215 can be directly coupled to (e.g., electrically in contact with) charge storage node 202 of that particular memory cell.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory, cell groups $201_0$ and $201_1$ can include the same number of memory cells. For example, memory cell group $201_0$ can include memory cells 210, 212, and 214, and memory cell group $201_1$ can include memory cells 221, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory cells 210 through 215 can be randomly selected during a read or write operation. Thus, memory device 200 can be called a dynamic random-access memory device (DRAM) device. Unlike some conventional DRAM devices that store information in a structure such as a capacitor, memory device 200 can store information in the form of charge in charge storage node 202. As mentioned above, charge storage node 202 can be the floating gate (e.g., floating gate 202) of transistor T1. Thus, memory device 200 can also be called a floating-gate based DRAM device.

Memory device 200 can include access lines (e.g., word lines) 241, 242, and 243 that can carry respective signals (e.g., word line signals) WL1, WL2, and WL3. Access lines 241, 242, and 243 can be shared between memory cell groups $201_0$ and $201_1$. Access lines 241, 242, and 243 can be selectively activated (e.g., activated one at a time) during an operation read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored information in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), using a single access line in memory device 200 to control access to a respective memory cell (e.g., to control both transistors T1 and T2) can save space and simplify operation of memory device 200.

In memory device 200, the gate of each of transistors T1 and T2 can be part of a respective access line (e.g., a respective word line). For example, the gate of each of transistors T1 and T2 of memory cells 210 and 221 can be part of access line 241. The gate of each of transistors T1 and T2 of memory cells 212 and 213 can be part of access line 242. The gate of each of transistors T1 and T2 of memory cells 214 and 215 can be part of access line 243.

As shown in FIG. 2, memory device 200 can include data lines (e.g., bit lines) 221, 221', 222, and 222' that can carry respective signals (e.g., bit line signals) BL1, BL1*, BL2, and BL2*. During a read operation, memory device 200 can use data lines 221 and 221' to read information from a selected memory cell of memory cell group $201_0$, and data lines 222 and 222' to read information from a selected memory cell of memory cell group $201_1$. During a write operation, memory device 200 can use data line 221 to store information in a selected memory cell of memory cell group $201_0$, and data line 222 to store information in a selected memory cell of memory cell group $201_1$.

Transistor T1 includes a channel portion between the source and drain (e.g., non-gate terminals) of transistor T1. Transistor T2 includes a channel portion between the source and drain (e.g., non-gate terminals) of transistor T2. The two channel portions of respective transistors T1 and T2 can be controlled by the same access line (e.g., by a single word line), such as one of access lines 241, 242, and 243. The channel portion of transistor T2 can be formed from a material or a combination of materials a high band-gap material) that can provide a relatively low leakage between charge storage node 202 of a respective memory cell and data line 221 or 222. Such a low leakage can improve accuracy of information read from a selected memory cell and can improve the retention of information stored in the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., 210, 212, or 214) can include transistor T1 (e.g., can include a read current path through the source, drain, and channel portion of transistor T1) of that particular memory cell and data lines 221 and 221'. In memory cell group $201_1$, a read path of a particular memory cell (e.g., 221, 213, or 215) can include transistor T1 (e.g., can include a read current path through the source, drain, and channel portion of transistor T1) of that particular memory cell and data lines 222 and 222'. Since transistor T1 can be used in a read path to read information from the respective memory cell during a read operation, transistor T1 can be called a read transistor.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through the source, drain, and channel portion of transistor T2) of that particular memory cell and data line 221. In memory cell group $201_1$, a write path of a particular memory cell (e.g., 221, 213, or 215) can include transistor T2 (e.g., can include a write current path through the source, drain, and channel portion of transistor T2) of that particular memory cell and data line 222. Since transistor T2 can be used in a write path to store information in a respective memory cell during a write operation, transistor T2 can be called a write transistor.

Each of transistors T1 and T2 can have a threshold voltage (Vt). Transistor T1 has a threshold voltage Vt1. Transistor T2 has a threshold voltage Vt2. The value of threshold voltage Vt2 can be greater than the value of threshold voltage Vt1. The difference in values of threshold voltages Vt1 and Vt2 allows reading (e.g., sensing) of information stored in charge storage node 202 in transistor T1 on the read path without affecting (e.g., without turning on) transistor T2 on the write path (e.g., path through transistor T2). This can prevent leaking of charge from charge storage node 202 to the write path.

In a structure of memory device 200, transistor T1 can be formed (e.g., engineered) such that threshold voltage Vt1 of transistor T1 can be less than zero volts (e.g., Vt1<0V) regardless of the value information stored charge storage node 202 of transistor T1 (e.g., regardless of the state (e.g., "0" or "1") of charge storage node 202). Thus, in this structure, the relationship between the values of threshold voltages Vt1 and Vt2 can be express as follows, Vt1 for state "0"<Vt1 for state "1"<0V and Vt2=0V (or alternatively Vt2>0V).

In an alternative structure of memory device 200, transistor T1 can be formed (e.g., engineered) such that threshold voltage Vt1 of transistor T1 can be less than zero volts if information stored in memory cell 210 through 215 has one value corresponding to a particular state (e.g., Vt1<0V (or alternatively Vt1=0V) for state "0"), and such that threshold voltage Vt1 of transistor T1 can be greater than zero volts if information stored in memory cell 210 through 215 has another value corresponding to another particular state (e.g., Vt1>0V for state "1", and Vt2>Vt1). Thus, in the alternative structure, the relationship between the values of threshold voltages Vt1 and Vt2 can be express as follows, Vt1 for state "0"<Vt1 for state "1"<Vt2, where Vt1 for state "0"<0V (or alternatively Vt1 for state "0"=0V) and Vt1 for state "1">0V.

In another alternative structure, transistor T1 can be formed (e.g., engineered) such that threshold voltage Vt1 of transistor T1 can be at least zero volts (e.g., Vt1=0 or Vt1>0V) regardless of the information stored in charge storage node 202 of transistor T1 (e.g., regardless of the state (e.g., "0" or "1") of charge storage node 202). Thus, in this alternative structure, the relationship between the values of threshold voltages Vt1 and Vt2 can be express as follows, Vt1 (for state "0")<Vt1 (for state "1")<Vt2, where Vt1 for state "0"=0V (or alternatively Vt1 for state "0">0V.

During read operation of memory device 200, only one memory cell of the same memory cell group can be selected one at a time to read information from the selected memory cell. For example, only memory cell 210, 212, or 214 of memory cell groups $201_0$ can be selected at a time during a read operation to read information from the selected memory cell (e.g., memory cell 210, 212, or 214 in this example). In another example, only memory cell 221, 213, or 215 of memory cell groups $201_1$ can be selected one at a time during a read operation to read information from the selected memory cell (e.g., memory cell 221, 213, or 215 in this example).

During read operation, memory cells of different memory cell groups (e.g., memory cell groups $201_0$ and $201_1$) that share the same access line (e.g., word line 241, 242, or 243) can be concurrently selected (or alternatively can be sequentially selected). For example, memory cells 210 and 221 can be concurrently selected during a read operation to read concurrently read) information from memory cells 210 and 221. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g. sensed) from a read path (described above) that includes transistor T1 of the selected memory cell (e.g., memory cell 210, 212, or 214) and data lines 221 and 221'. The value of information read from the selected memory cell of memory cell group $201_1$ during a read operation can be determined based on the value of a current detected (e.g. sensed) from a read path that includes transistor T1 of the selected memory cell (e.g., memory cell 221, 213, or 215) and data lines 222 and 222'.

Memory device 200 can include detection circuitry (not shown) that can operate during a read operation to detect (e.g., sense) a current (e.g., I1, not shown) on a read path that includes data lines 221 and 221' and a current (e.g., I2, not shown) on a read path that includes data lines 222 and 222'. The value of the detected current can be based on the value of information stored in the selected memory cell. For example, depending on the value of information stored in the selected memory cell of memory cell group $201_0$, the value of the detected current (e.g., the value of I1) between data lines 221 and 221' can be zero or greater than zero. Similarly, depending on the value of information stored in the selected memory cell of memory cell group $201_1$, the value of the detected current (e.g., the value of I2) between data lines 222 and 222' can be zero or greater than zero. Memory device 200 can include circuitry (not shown) to translate the value of detected current into the value (e.g., "0", or a combination of multi-bit values) of information stored in the selected memory cell.

During write operation of memory device 200, only one memory cell of the same memory cell group can be selected one at a time to store information in the selected memory cell. For example, only memory cell 210, 212, or 214 of memory cell groups $201_0$ can be selected one at a time during a write operation to store information in the selected memory cell (e.g., memory cell 210, 212, or 214 in this example). In another example, only memory cell 221, 213, or 215 of memory cell groups $201_1$ can be selected one at a time during a write operation to store information in the selected memory cell (e.g., memory cell 221, 213, or 215 in this example).

During write operation, memory cells of different memory cell groups (e.g., memory cell groups $201_0$ and $201_0$ that share the same access line (e.g., word line 241, 242, or 243) can be concurrently selected. For example, memory cells 210 and 221 can be concurrently selected during a write operation, operation to store (e.g., concurrently store) information in memory cells 210 and 221. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (describe above) that includes data line 221 and transistor T2 of the selected memory cell (e.g., memory cell 210, 212, or 214). Information to be stored in a selected memory cell of memory cell group $201_1$ during a write operation can be provided through a write path (described above) that includes data line 222 and transistor T2 of the selected memory cell (e.g., memory cell 221, 213, or 215). As described above, the value (e.g., binary value) of information stored in a particular memory cell among memory cells 210 through 215 can be based on the amount of charge in charge storage node 202 of that particular memory cell.

In a write operation, the amount of charge in charge storage node 202 of a selected memory cell can be changed (to reflect the value of information stored in the selected memory cell) by applying a voltage on a write path that includes transistor T2 of that particular memory cell and the data line (e.g., data line 221 or 222) coupled to that particular memory cell. For example, a voltage having one value (e.g., 0V) can be applied on data line 221 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in charge storage node 202 of a particular memory cell by providing the information (to be stored) through a write path that includes transistor T2 of that particular memory cell and the data line (e.g., data line 221 or 222) coupled to that particular memory cell.

Figure 3:
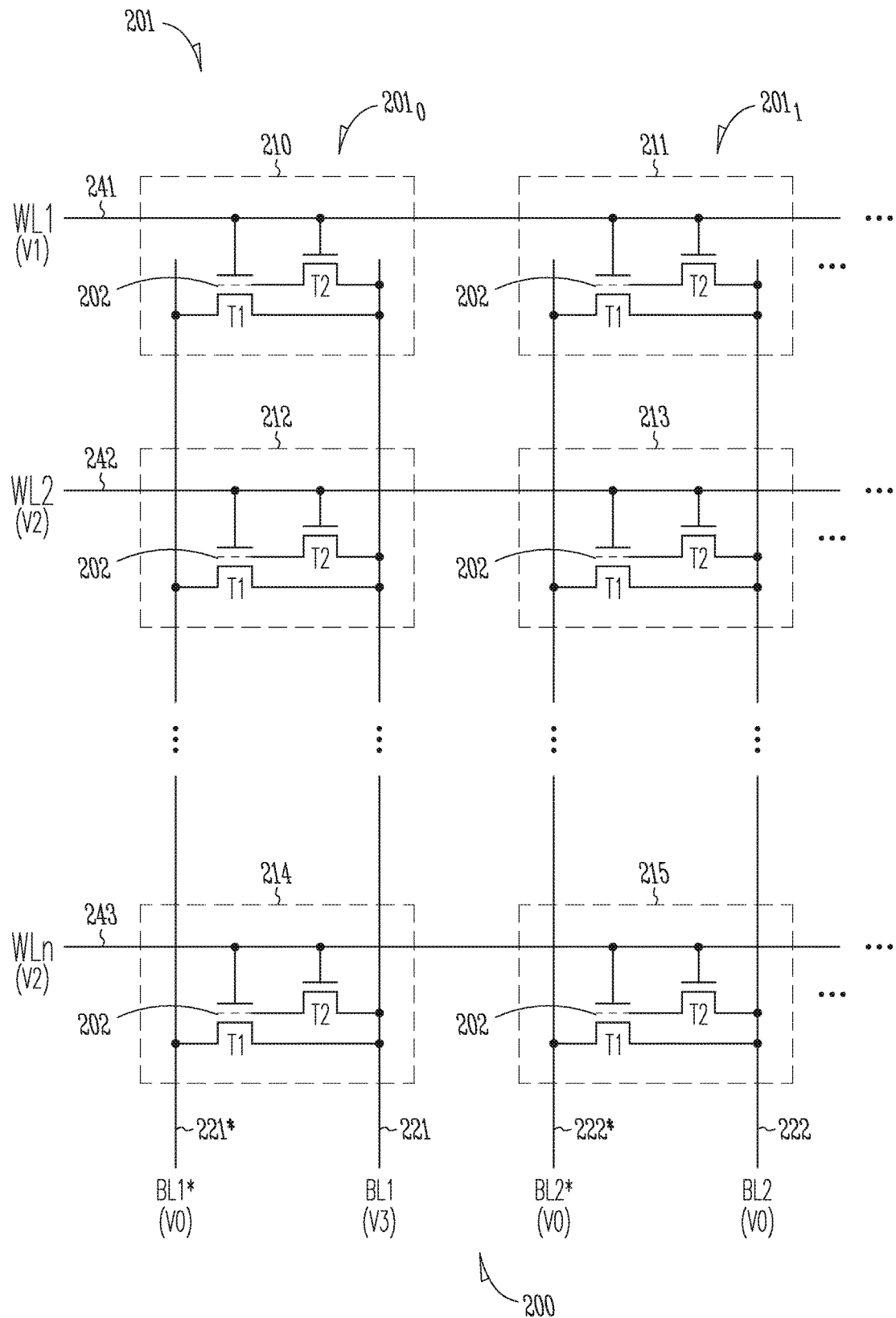
FIG. 3 shows the memory device of FIG. 2 including example voltages used during a read operation of the memory device, according to some embodiments described herein.

FIG. 3 shows memory device 200 of FIG. 2 including example voltages V0, V1, V2, and V3 used during a read operation of memory device 200, according to some embodiments described herein. The example of FIG. 3 assumes that memory cell 210 is a selected memory cell (e.g., target memory cell) during a read operation to read (e.g., to sense) information stored (e.g., previously stored) in memory cell 210. Memory cells 211 through 215 are assumed to be unselected memory cells. This means that memory cells 211 through 215 are not accessed and information stored in memory cells 211 through 215 are not read while information is read from memory cell 210 in the example of FIG. 3.

In FIG. 3, voltages V0, V1, V2, and V3 can represent different voltages applied to respective access lines 214, 242, and 243, and data lines 221, 221*, 222, and 222* during a read operation of memory device 200. As an example, voltages V0, V1, V2, and V3 can have values of 0V ground), −0.3V, −0.75V, and 0.5V, respectively. Different values may be used.

In the read operation shown in FIG. 3, voltage V1 can have a value (a first read voltage value) to turn on read transistor T1 of memory cell 210 (a selected memory cell in this example) and turn off (or keep off) write transistor T2 of memory cell 210. This allows in information to be read from memory cell 210. Voltage V0 and V2 and can have values, such that transistors T1 and T2 of each of memory cells 211 through 215 (unselected memory cells in this example) are turned off (e.g., kept off). Voltage V3 can have a second read voltage value, such that a current (e.g., read current) may be formed on a read path that include data lines 221 and 221* and transistor T1 of memory cell 210. This allows a detection of current on the read path coupled to memory cell 210. A detection circuitry (not shown) of memory device 200 can operate to translate the value of detected current (during reading of information from a selected memory cell) into the value (e.g., "0", "1", or a combination of multi-bit values) of information read from the selected memory cell. In the example of FIG. 3, the value of detected current on data lines 221 and 221\* can be translated into the value of information read from memory cell 210.

In the read operation shown in FIG. 3, the voltages applied to respective access lines 241, 242, and 243 can cause transistors T1 and T2 of each of memory cells 211 through 215, except transistor T1 of memory cell 210, to turn off (or to remain turned off). Transistor T1 of memory cell 210 may or may not turn on, depending on the value of the threshold voltage Vt1 of transistor T1 of memory cell 210. For example, if transistor T1 of each of memory cells (e.g., 210 through 215) of memory device 200 is formed such that $Vt_1 < 0V$ regardless of the value (e.g., the state) of information stored in a respective memory cell 210, then transistor T1 of memory cell 210 in this example can turn on and conduct a current between data lines 221 and 221\* (through transistor T1 of memory cell 210). Memory device 200 can determine the value of information stored in memory cell 210 based on the value of the current (e.g., measured by detection circuitry) between read data lines 221 and 221\*.

Figure 4:
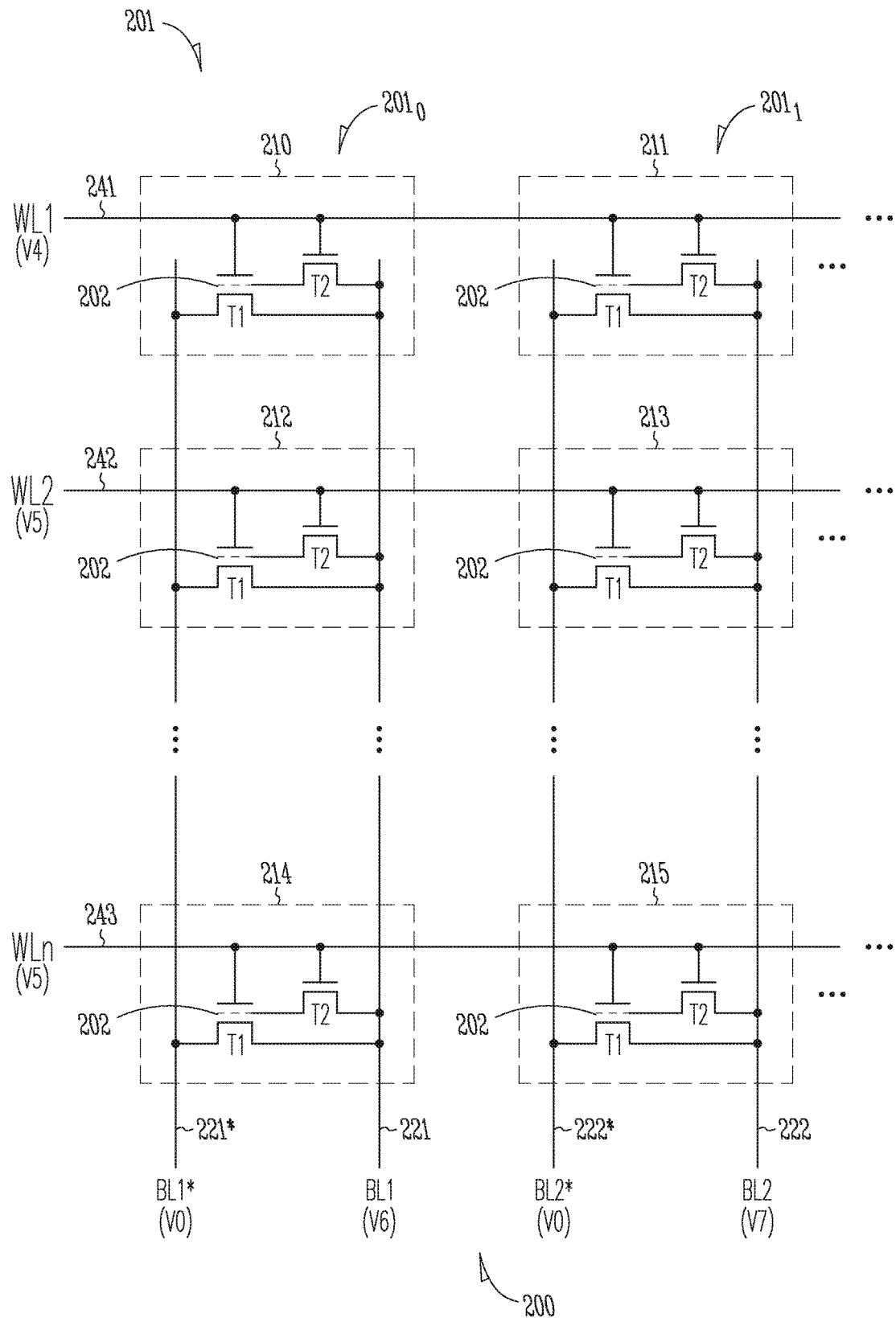
FIG. 4 shows the memory device of FIG. 2 including example voltages used during a write operation of the memory device, according to some embodiments described herein.

FIG. 4 shows memory device 200 of FIG. 2 including example voltages V0, V4, V5, V6, and V7 used during a write operation of memory device 200, according to some embodiments described herein. The example of FIG. 4 assumes that memory cells 210 and 211 are selected memory cell (e.g., target memory cells) during a write operation to store information in memory cells 210 and 211. Memory cells 212 through 215 are assumed to be unselected memory cells. This means that memory cells 212 through 215 are not accessed and information stored is not to be stored in memory cells 212 through 215 while information is stored in memory cells 210 and 211 in the example of FIG. 4.

In FIG. 4, voltages V0, V4, V5, V6, and V7 can represent different voltages applied to respective access lines 214, 242, and 243, and data lines 221, 221', 222, and 222' during a write operation of memory device 200. As an example, voltages V0, V4, and V5 can have values of 0V, 3.3V, and −0.75V. These values are example values. Different values may be used. The values of voltages V6 and V7 can be the same or different depending the value (e.g., "0" or "1") of information to be stored in memory cells 210 and 211. For example, the values of voltages V6 and V7 can be the same if the memory cells 210 and 211 are to store information having the same value (e.g., V6=V7=0V if information to be stored in each memory cell 210 and 211 is "0", and V6=V7=1V to 3V if information to be stored in each memory cell 210 and 211 is "1"). In another example, the values of voltages V6 and V7 can be different (e.g., V6≠V7) if the memory cells 210 and 211 are to store information having different values. For example, V6=0V and V7=1V to 3V if "0" to be stored in memory cell 210 and "1" is to be store in memory cell 211). Different values may be used, or V6=1V to 3V and V7=0V if "1" to be stored in memory cell 210 and "0" is to be store in memory cell 211). The range of voltage of 1V to 3V used in the examples here can be other positive values different from the range of 1V to 3V.

In a write operation of memory device 200, voltage V5 can have a value, such that transistors T1 and T2 of each of memory cells 212 through 215 (unselected memory cells in this example) are turned off (e.g., kept off). Voltages V4 can have a value to turn on transistor T2 of each of memory cells 210 and 211 (selected memory cells in this example) and form a write path between charge storage node 202 of memory cell 210 and data line 221 and a write path between charge storage node 202 of memory cell 211 and data line 222. A current (e.g., write current) may be formed between charge storage node 202 of memory cell 210 and data line 221. This current can change the amount of charge on charge storage node 202 of memory device 210 to reflect the value of information to be stored in memory cell 210. Another current (e.g., another write current) may be formed between charge storage node 202 of memory cell 211 and data line 222. This current can change the amount of charge on charge storage node 202 of memory, device 211 to reflect the value of information to be stored in memory cell 211.

In the example write operation of FIG. 4, the value of voltage V6 may cause charge storage node 202 of memory cell 210 to discharge or to be charged, such that the resulting charge (e.g., charge remaining after the discharge or charge action) on charge storage node 202 of memory cell 210 can reflect the value of information stored in memory cell 210. Similarly, the value of voltage V7 in this example may cause charge storage node 202 of memory cell 211 to discharge or to be charged, such that the resulting charge (e.g., charge remaining after the discharge or charge action) on charge storage node 202 of memory cell 211 can reflect the value of information stored in memory cell 211.

Figure 5A:
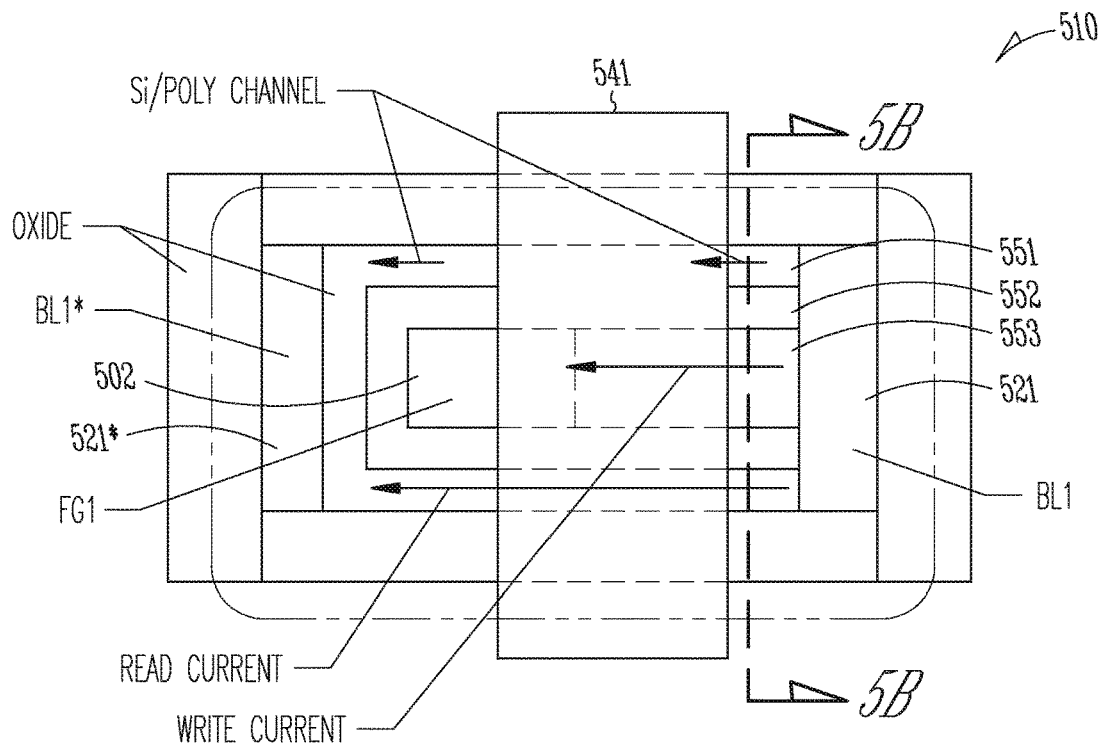
FIGS. 5A-5B show a memory structure of the memory device of FIG. 2, according to some embodiments described herein.

FIG. 5A is an illustration of the structure of a memory cell, according to some embodiments described herein. The memory cell 510 can be any of the memory cells shown in FIG. 2, such as memory cell 210 for example. The memory cell includes a charge storage transistor T1 and a write transistor T2. In the depicted example, the charge storage transistor T1 includes a floating gate (FG) structure 502 as the charge storage structure of the memory cell 510. The charge storage transistor T1 also includes a control gate. Write transistor T2 includes a gate region, a source region and a drain region. The source or drain region of the write transistor T2 is directly coupled to the charge storage structure (FG) of the charge storage transistor T1. When the gate of the write transistor is activated it creates a write channel region. Because the source or drain of the write transistor contacts the floating gate of the charge storage transistor, the write channel of T2 directly contacts the floating gate of T1.

FIG. 5A shows a read channel portion 551 and a separate write channel portion 553. The read channel portion is coupled between bit lines of a bit line pair (e.g., BL1 and BL1\*). The read channel portion 551 is a two-sided read channel with one side on each side of the floating gate structure 502. The read channel portion 551 is separated from the floating gate structure 502 by an insulating material 552 (e.g., silicon oxide (SiO2), hafnium oxide (HfO2), aluminum oxide (Al2O3), etc.). A first channel portion is arranged adjacent to a first surface of the floating gate structure 502, and a second channel portion is arranged adjacent to a second surface of the floating gate structure 502. The two channel portions are arranged on opposite surfaces of the floating gate structure 502. The read channel portion 551 is contacted by bit line pair 521, 521\* or BL1, BL1\*. The bit lines BL1, BL1\* extend orthogonal to the plane of the page of FIG. 5A. Write bit line 521 is shown contacting the write channel portion 553.

FIG. 5A also shows access line 541, which may be WU in FIG. 2. The access line 541 is shown overlapping parts of the floating gate structure 502, the read channel portion 551, and the write channel portion 553. The read channel portion 551 and the access line 541 are separated from each other by an insulating material. The floating gate 502 and the access line are separated from each other by an insulating material. The insulating material may be the same or different from the insulating material separating the read channel portion 551 and the access line 541. In some embodiments, the access line 541 does not overlap the floating gate structure 502. The access line 541 and the floating gate 502 may include the same material or different materials.

Because the access line overlaps both the write channels and the read channels, the one access line 541 can be used to activate both the write channel and the read channel of a memory cell. The threshold voltage (Vt) of the write channel portion can be greater than a threshold voltage of the read channel portion. This prevents a read operation using the access line from affecting the charge on the charge storage structure. The difference in Vt can be implemented by including semiconductor material in the write channel portion having a greater bandgap than material included in the read channel portion.

In certain embodiments, the read channel portion includes polysilicon (or poly). The write channel can include material with a higher bandgap than polysilicon. In certain embodiments, the write channel can include gallium phosphide (GaP). In certain embodiments, the write channel can include an oxide semiconductor material, such as one or more of zinc tin oxide (ZTO), indium zinc oxide (IZO), zinc oxide (ZnOx), indium gallium zinc oxide (IGZO), indium gallium silicon oxide (IGSO), indium oxide (InOx, In2O3), tin oxide (SnO2), titanium oxide (TiOx), zinc oxide nitride (ZnxOyNz), magnesium zinc oxide (MgxZnyOz), indium zinc oxide (InxZnyOz), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO).

Figure 5B:
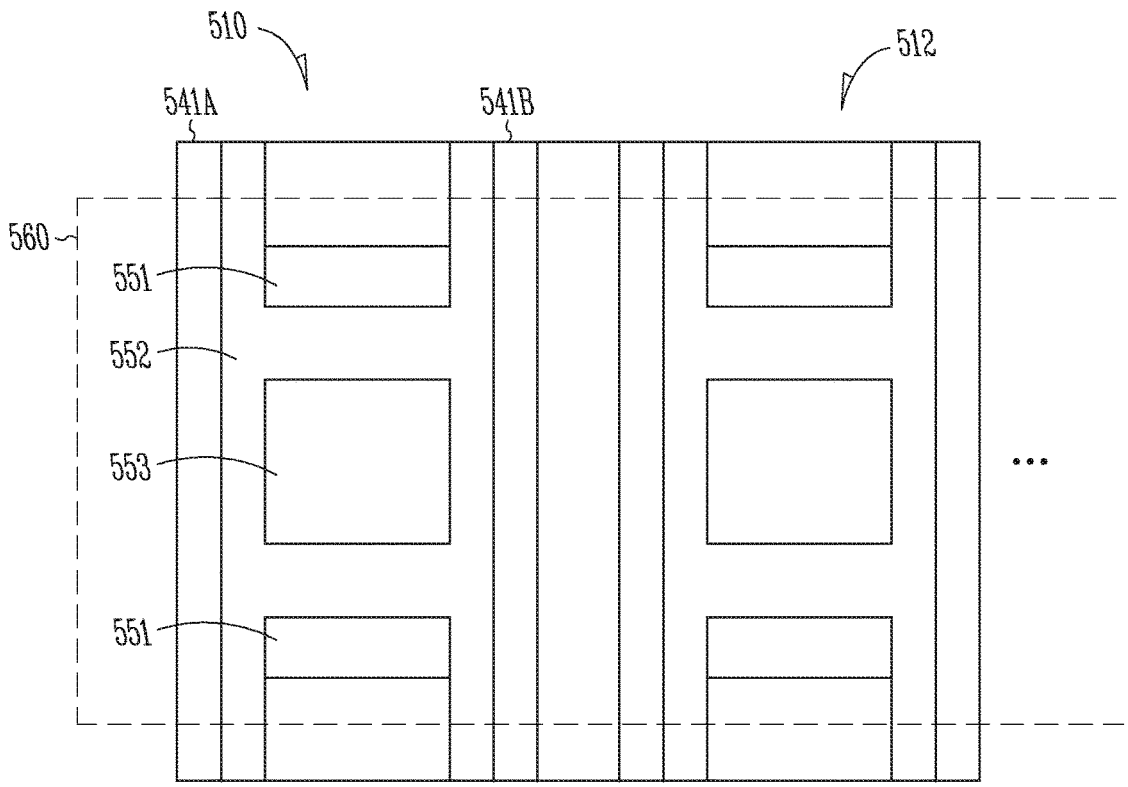

In FIG. 5A, the bit lines BL1 and BL* extend in a direction orthogonal to the page showing the Figure. Thus in FIG. 2, the memory cells 210, 212, and 214 of the first column would extend into the page of FIG. 5A. FIG. 5B is a cross section view looking toward the access line 541. The view shows two memory cells 510, 512 for simplicity. The memory cells may be memory cells 210 and 212 in FIG. 2. The dashed area 560 shows the direction that memory cells of the 3D memory array would be traversed along the same bit line pair (e.g., BL1 and BL1*). Additional rows in the same plane as memory cells 510 and 512 can be formed to the left and right of the memory cell 510 in FIG. 5A.

The view in FIG. 5B shows the read channel 551, the write channel 553, and an access line. As shown in FIG. 5B, the access line can be a two-sided access line that includes a first access line portion 541A arranged adjacent to a first side (e.g., a back side) of the write channel portion 553, and a second access line 541B portion arranged adjacent to a second side a front side) of the write channel portion 553. A shown in FIG. 5B, the second side of the access line can be opposite the first side with the write channel portion 553 and the floating gate structure between the two portions. The front and back portions of the two-sided access line provide improved control of the charge storage transistor. The front and back portions of the two-sided access line are electrically connected together so that one electrical signal drives both access line portions.

While FIGS. 5A and 5B are used to describe one row of a two-dimensional array of memory cells arranged horizontally, additional memory cells can be formed in the vertical direction to form a three-dimensional (3D) memory array. Multiple decks or levels of cells can be formed in a stack to form the 3D memory array.

Figure 6A:
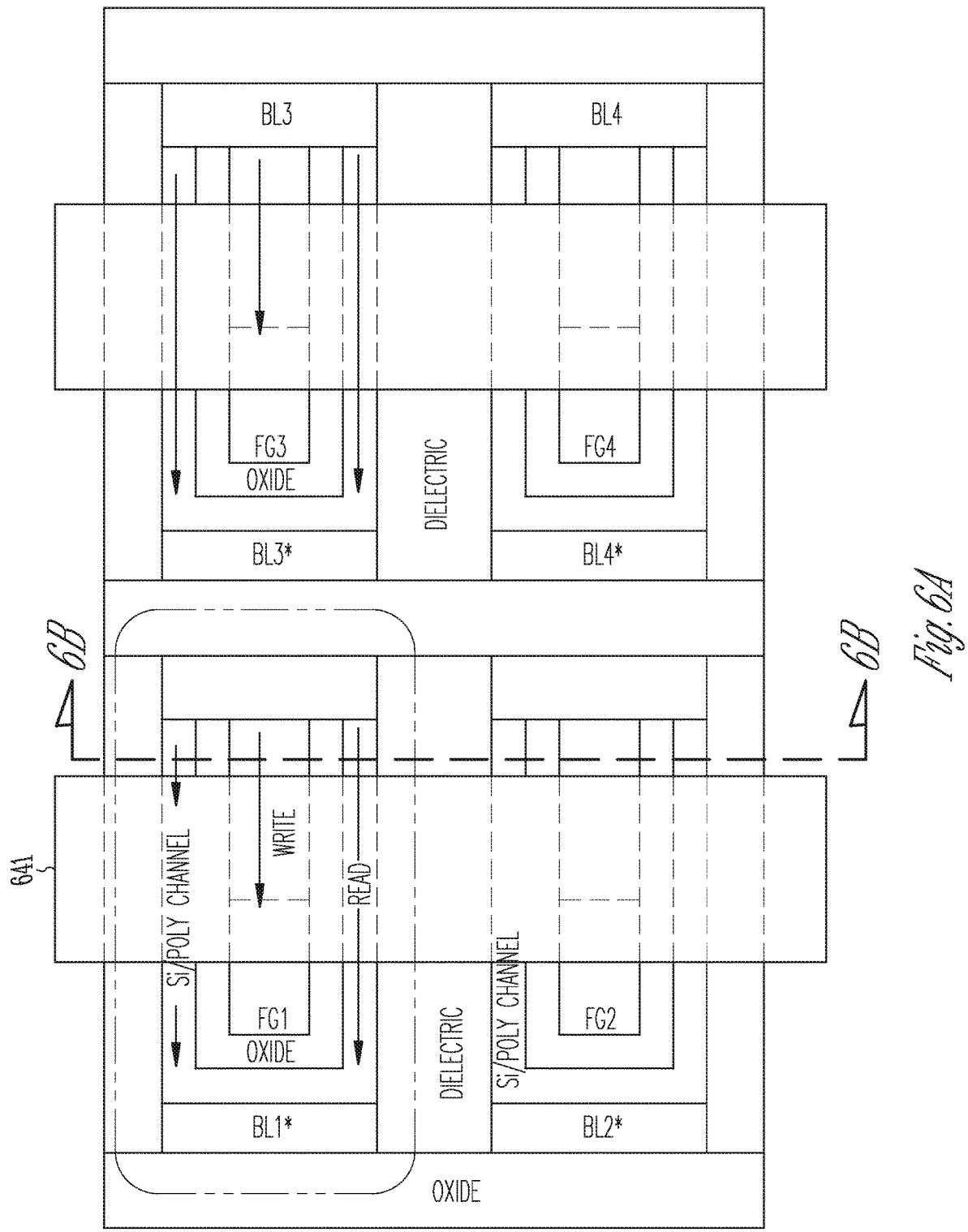

FIG. 6A is an illustration of four 2T memory cells arranged in multiple levels. As in the example of FIG. 5A, memory cells connected to the same bit line pair (e.g., BL1, BL1*) extend orthogonally in one level in the direction in and out of the page of FIG. 6A. Therefore, the memory cells in FIG. 6A represent a three dimensional memory array.

Figure 6B:
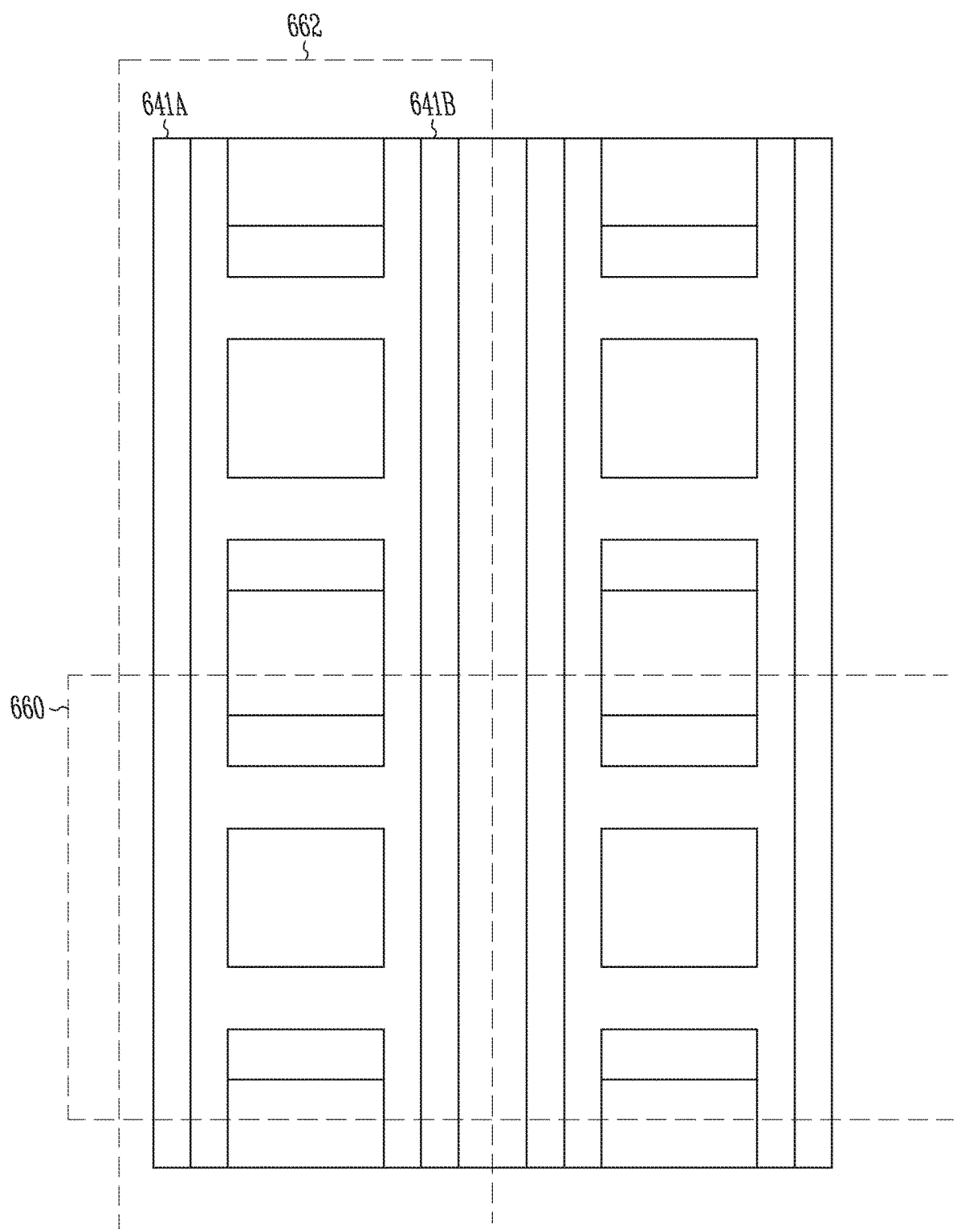

FIG. 6B is the view along A-A' in FIG. 6A looking toward the access line 641. Dashed area 660 shows the direction that memory cells of the 3D memory array would be traversed along the same bit line pair (e.g., BL1 and BL1*). Dashed area 662 shows the direction that memory cells of the 3D memory array would be traversed along the same access line (e.g., WL1). The example of FIGS. 6A and 6B shows two rows and two columns of memory cells for simplicity, but an implementation would include many memory cells in each of the three dimensions.

Each of the 2T memory cells in FIG. 6A includes two transistors T1 and T2. Memory cells arranged in vertical column of memory cells can be connected to one access line (e.g., access line 641 or WL1) extending vertically in the 3D memory array. The vertically extending access line is coupled to gates of both the charge storage transistor T1 and the write transistor T2 of a 2T memory cell in each of multiple respective levels of the column of memory cells. In some embodiments, the charge storage transistor is a floating gate transistor and the access line is coupled to control gates of the floating gate transistors and the write transistors of the 2T memory cells in the multiple respective levels of the multiple vertically arranged levels. The access line is shown overlapping the floating gates. In some embodiments, the access line does not overlap the floating gate. For example, the bottom edge of the access line 641 can be higher than the top edge of floating gates FG1 and FG2.

The vertically extending access line is operable for performing both write operations and read operations of each of the 2T memory cells to which it is coupled. A single bit line pair (e.g., bit line pair BL1, BL1*) is coupled to multiple 2T memory cells in a respective level memory cells. The bit line pair is operable for performing both write operations and read operations of each of the 2T memory cells to which it is coupled.

FIG. 7 through FIG. 12 show processes of forming a memory device, according to some embodiments described herein. The memory device includes multiple levels of 2T memory cells. The multiple levels are arranged vertically. As shown in FIG. 7, multiple levels of a sacrificial material 774 alternated with multiple levels of a dielectric material 772 are formed vertically on a substrate 770. The levels may be layers fabricated by a material deposition process. The dielectric material may include, for example, $SiO_2$. In other examples, multilayer dielectrics may be utilized. The sacrificial material may include, for example, silicon nitride ($Si_3N_4$).

Figure 8:
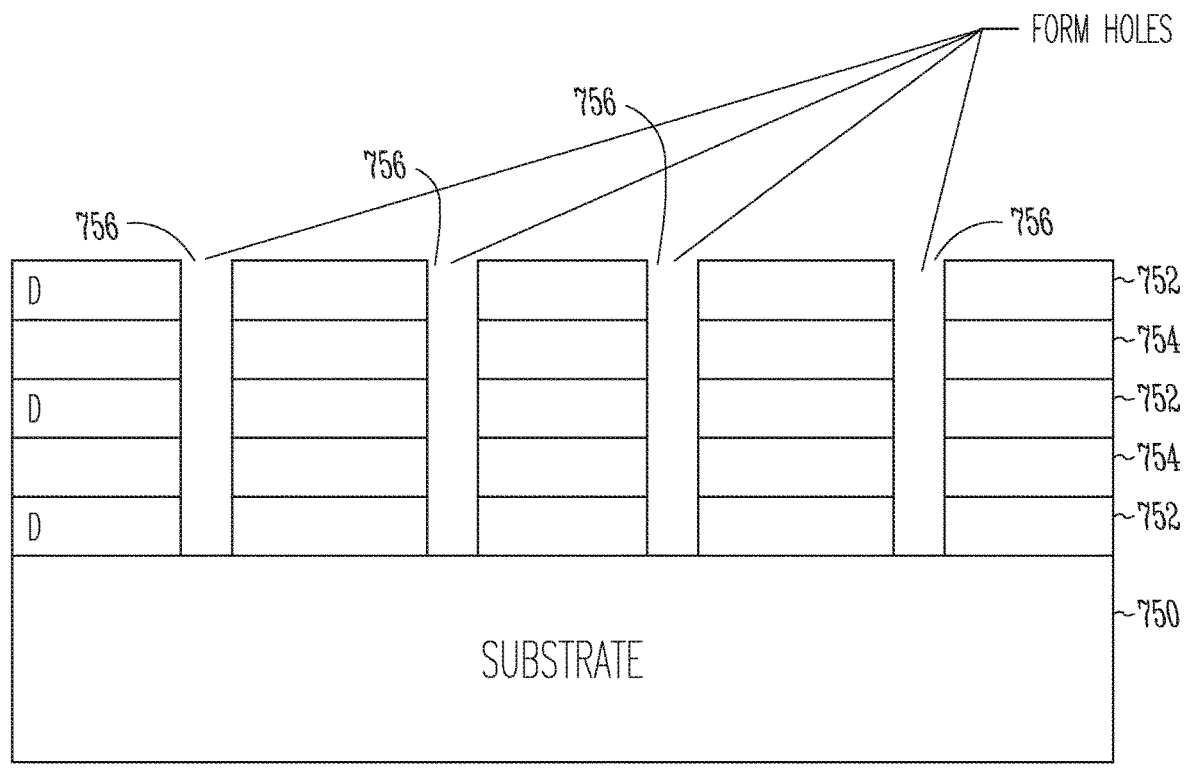
Figure 9:
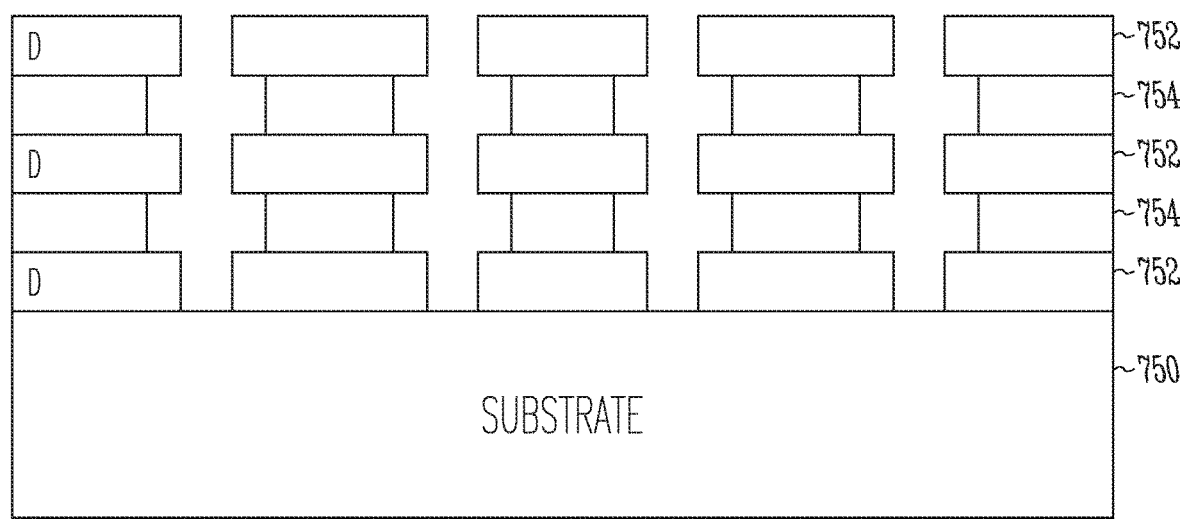

In FIG. 8, openings 776 (e.g., holes) are formed in the multiple levels. The openings can be formed by drilling or etching. The openings expose sides of the levels with the sacrificial material. In FIG. 9, recesses are formed in the multiple levels of sacrificial material 774. The recesses can be formed using an isotropic etch process that essentially removes only the sacrificial material and selective to the dielectric material 752. As shown in FIG. 9, the resulting structure includes openings in the multiple levels of dielectric material 752 and multiple levels of recesses in the levels of sacrificial material 774.

Figure 10:
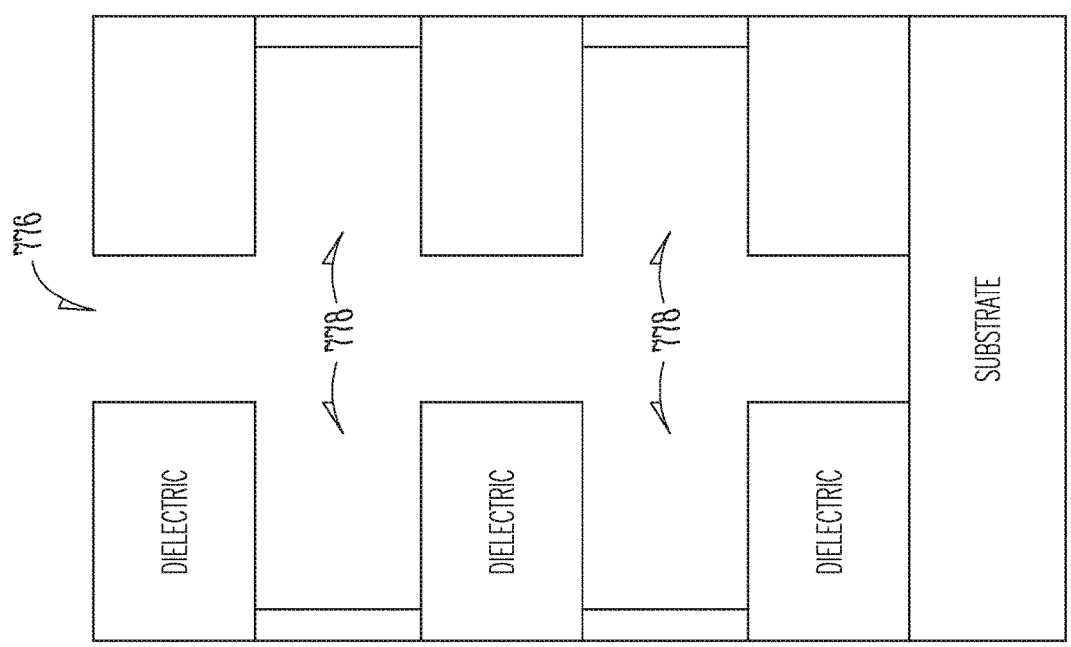

FIG. 10 is an illustration of a portion of FIG. 9 showing opening 756 and multiple levels of recesses 778. Multiple layer or films can be deposited in the recesses to form multiple levels of read channel regions, write channel regions, and charge storage structures for multiple levels of write transistors and charge storage transistors of the multiple levels of the 2T memory cells.

Figure 11:
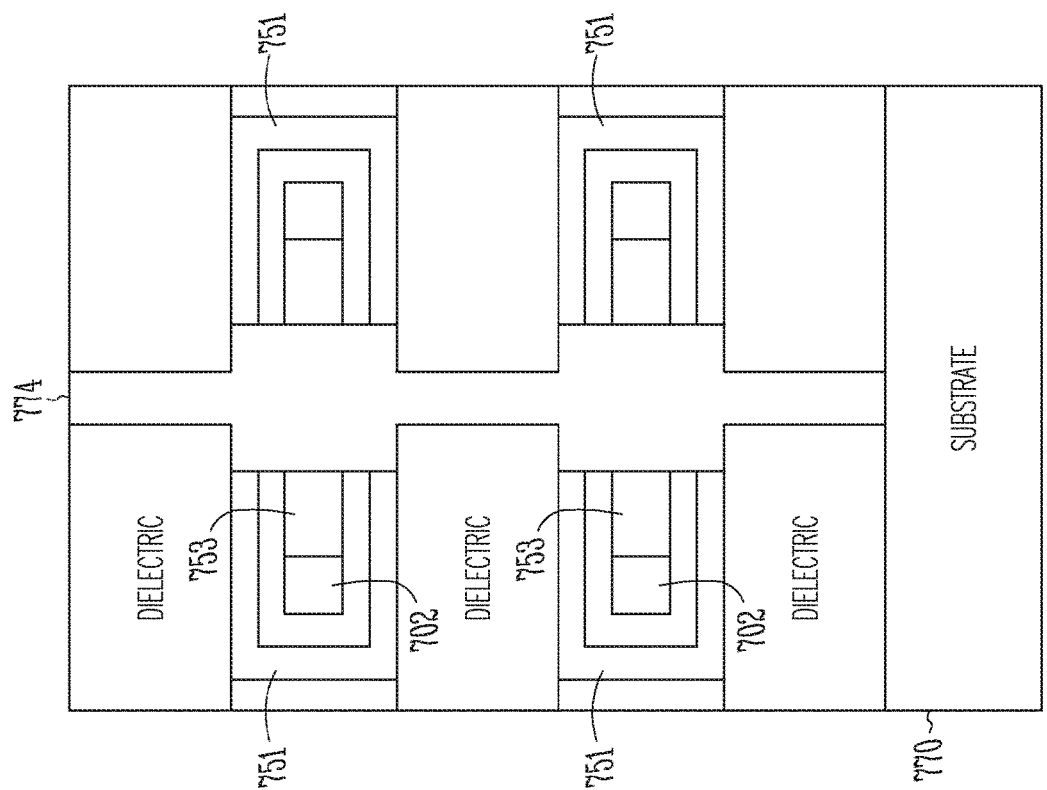

In FIG. 11, a layer or film of polysilicon is formed in the recesses to form a read channel portion 751 for the charge storage transistors. As shown in the embodiment of FIG. 11, polysilicon film is disposed on two sides of a recess to form a two-sided channel region of a charge storage transistor. A layer or film of dielectric material 772 is formed over the polysilicon of the read channel portions. The dielectric material may be the same as the dielectric material of the multiple dielectric levels (e.g., $SiO_2$) or may be a different dielectric material. A gate oxide is disposed in the recesses to form a charge storage structure 702 of the charge storage transistors. The dielectric material 772 isolates the charge storage structure 702 from the read channel portion 751. In certain embodiments, the charge storage structure 702 is a floating gate structure of a floating gate transistor. In the embodiment of FIG. 11, the gate oxide is disposed between sides of the two-sided read channel portion 751 of the charge storage transistor. The dielectric material 772 isolates the floating gate structure from other conductive elements of the floating gate transistor.

A semiconductor material is formed in the recesses to form a write channel portion 753 for the write transistors of the 2T memory cells. The semiconductor material has a higher bandgap than the polysilicon of the read channel portion 751. In certain embodiments, the semiconductor material of the write channel portion 753 includes n-type GaP. In certain embodiments, the write channel portion 751 includes an oxide semiconductor material. The write channel region of the write transistors is formed to contact the charge storage structure 702.

Vertical openings are again formed in the multiple levels. The vertical openings are formed in the multiple levels of the dielectric material and the multiple levels of the channel regions. The layers or films of the read channel portions and the write channel portions may be etched back to prepare space for the bit lines formed later. The openings and etched areas are filled with sacrificial material 774. The sacrificial material may be the same or different from the sacrificial material of the multiple levels of sacrificial material.

When the read and write channels are formed, processing continues in a different direction than the one shown in FIG. 11 to form the gates of the write transistors and the control gates of the charge storage transistors. The multiple levels of channel regions are chopped drilled or etched) to isolate the individual read channel portions and write channel portions of the multiple levels. Gate oxide is deposited to form the gate regions of the write transistors and charge storage transistors. Openings (e.g., holes) are formed (e.g., by etching) for the access lines to contact the gate regions. The openings may be filled with conductive material (e.g., metal) to form the access lines. The access lines extend vertically in the multiple levels. A single access line (e.g., WL1 in FIG. 2) is formed to contact multiple memory cells in a column of memory cells. The same single access line contacts the gate region of a write transistor and the control gate region of a charge storage transistor of a 2T memory cell of a first level of the memory cells, and contacts the gate region of a write transistor and the control gate region of a charge storage transistor of a 2T memory cell of a second level of the memory cells. The access lines may be two-sided access lines, with gate regions for the write transistors and control gate regions for the charge storage transistors on two sides of a 2T memory cell.

Figure 12:
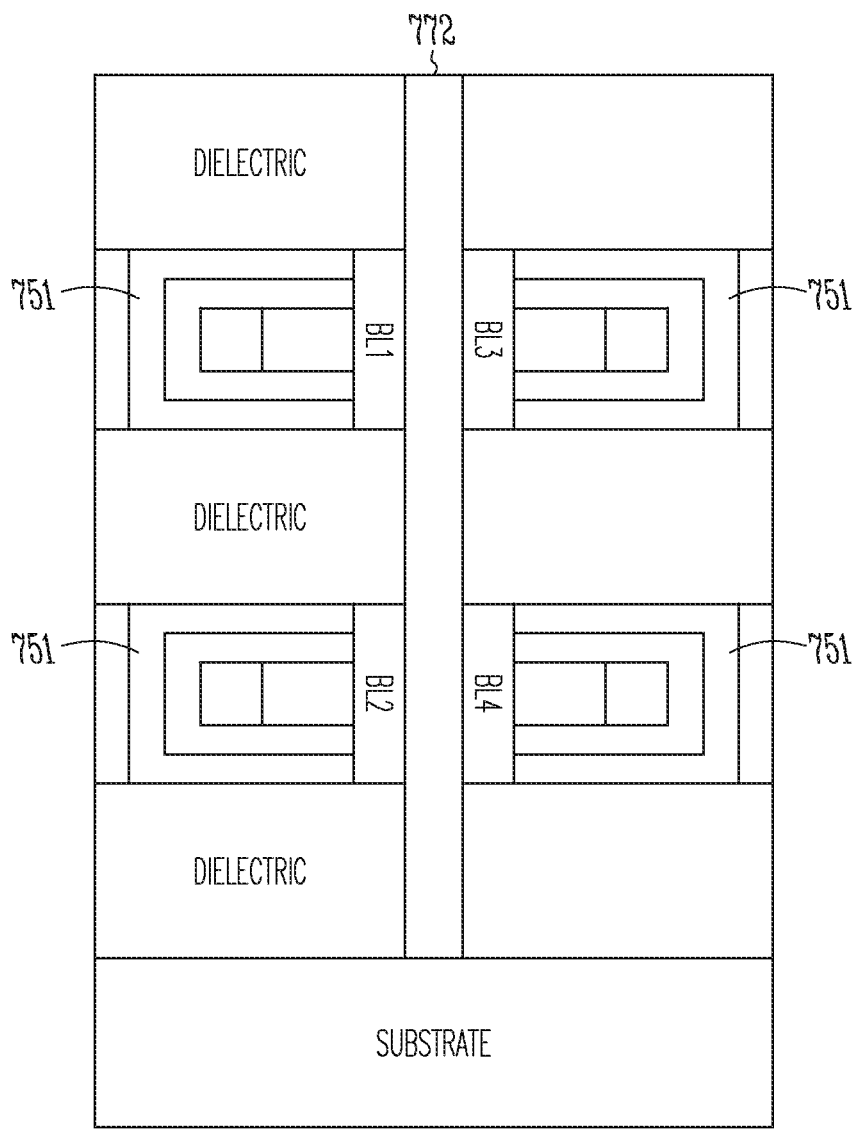

A shown in FIG. 12, the sacrificial material 774 or FIG. 11 is removed. The vertical opening is filled with conductive material to form one of the bit lines of the bit line pairs. At this point the bit lines may be shorted together by the conductive material. The formed bit lines are separated (e.g., by etching the conductive material), and the separation or opening is filled with a dielectric, such as an insulating oxide (e.g., $SiO_2$) to electrically isolate the formed bit lines. FIG. 12 shows formed bit lines BL1, BL2, BL3, and BL4. The bit lines extend in a direction orthogonal to the page showing FIG. 12, and contact one end of the read channel portion 751 of the memory cells.

The multiple levels of channel regions are again chopped (e.g., drilled or etched) to expose the opposite ends of the read channel portions 751. Conductive material is disposed in the opening to contact the opposite ends of the read channel portions. The conductive material may again be separated and the separation or opening filled with the insulating oxide to form the second bit line of the bit line pairs (e.g., bit lines BL1*, BL2*, BL3*, and BL4*).

The illustrations of apparatuses (e.g., memory devices 100 and 200) and methods (e.g., operations of memory devices 100 and 200) are intended to provide a general understanding of the structure of various embodiments and are not intended to provide a complete description of all the elements and features of apparatuses that might make use of the structures described herein. An apparatus herein refers to, for example, either a device or a system that can include memory devices 100 and 200.

Any of the components described above with reference to FIG. 1 through FIG. 4 can be implemented in a number of ways, including simulation via software. Thus, apparatuses, e.g., memory devices 100 and 200, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100 and 200 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 12 include apparatuses and methods of forming the apparatuses. One of the apparatuses includes memory device 200. Other embodiments including additional apparatuses and methods are described.

Additional Description and Examples

Example 1 is an apparatus comprising: multiple levels of two-transistor (2T) memory cells vertically arranged above a substrate, wherein each 2T memory cell includes: a charge storage transistor and a write transistor, wherein a source or drain region of the write transistor is directly coupled to a charge storage structure of the charge storage transistor; a vertically extending access line disposed to gate both the charge storage transistor and the write transistor of 2T memory cells in multiple respective levels of the multiple vertically arranged levels, wherein the vertically extending access line is operable for performing both write operations and read operations of each of the 2T memory cells to which it is coupled; and a single bit line pair coupled to multiple 2T memory cells in a respective level, and operable for performing both write operations and read operations of each of the 2T memory cells to which it is coupled.

In Example 2, the subject matter of Example 1, wherein the write transistor includes a write channel portion and the charge storage transistor includes a read channel portion separate from the write channel portion, the read channel portion coupled between bit lines of the single bit line pair; and wherein a threshold voltage of the write channel portion is greater than a threshold voltage of the read channel portion.

In Example 3, the subject matter of Example 2 optionally includes a vertically extending access line that overlaps both the write channel portion and the separate read channel portion of each of the 2T memory cells to which it is coupled.

In Example 4, the subject matter of any of Examples 2-3, wherein a bandgap of semiconductor material included in the write channel portion is greater than a bandgap of semiconductor material included in the read channel portion.

In Example 5, the subject matter of any of Examples 2-4, wherein the read channel portion comprises two channel sides including a first channel portion arranged adjacent to a first surface of the charge storage structure and a second channel portion arranged adjacent to a second surface of the charge storage structure, and wherein the second surface is on an opposite side of the charge storage structure from the first surface.

In Example 6, the subject matter of any of Examples 1-5 T memory cell is a floating gate transistor and the charge storage structure is a floating gate structure of the floating gate transistor.

In Example 7, the subject matter of Example 6 T memory cells in multiple respective levels of the multiple vertically arranged levels.

Example 8 is a method of forming multiple levels of two-transistor (2T) memory cells, the method comprising: forming, vertically on a substrate, multiple levels of a sacrificial material alternated with multiple levels of a dielectric material; forming first openings in the multiple levels of the dielectric material and forming multiple levels of recesses in the multiple levels of the sacrificial material; forming multiple levels of channel regions for write transistors and charge storage transistors of the 2T memory cells, wherein a channel region of a write transistor contacts a charge storage structure of a charge storage transistor in each 2T memory cell; forming second vertical openings in the multiple levels of the dielectric material and the multiple levels of the channel regions, and filling the second vertical openings with the sacrificial material; forming gate regions of the write transistors and the charge storage transistors of the 2T memory cells; forming multiple vertically extending access lines, each access line to control gate regions of both a charge storage transistor and a write transistor of a 2T memory cell in multiple respective levels of the 2T memory cells; and removing the sacrificial material and forming bit line pairs for the 2T memory cells using the second vertical openings, wherein only one bit line pair contacts one 2T memory cell.

In Example 9, the subject matter of Example 8, wherein the forming multiple levels of channel regions includes disposing a polysilicon film on two sides of a recess to form a two-sided read channel region of a charge storage transistor.

In Example 10, the subject matter of Example 9 T memory cells includes disposing gate oxide between sides of the two-sided read channel region of the charge storage transistor.

In Example 11, the subject matter of Example 10, wherein the forming multiple levels of channel regions includes disposing gallium phosphide between the sides of the two-sided channel region of the charge storage transistor and in contact with the charge storage structure to form a write channel region of a write transistor.

In Example 12, the subject matter of any of Examples 9-11 T memory cells includes: removing the sacrificial material from a second vertical opening to expose a first end of the two-sided channel region; disposing a conductive material in the second vertical opening to form a first bit line of a bit line pair of a 2T memory cell, wherein the first bit line contacts the first end of the two-sided channel region; forming an opening to expose a second end of the two-sided channel region; and disposing the conductive material to form the second bit line of the bit line pair of the 2T memory cell, wherein the second bit line contacts the second end of the two-sided channel region.

In Example 13, the subject matter of any of Examples 8-12 T memory cells includes: filling the second vertical openings with a conductive material to form first bit lines of the bit line pairs; etching the conductive material to separate the formed first bit lines; and filling the opening with an insulating oxide to electrically isolate the formed first bit lines.

In Example 14, the subject matter of any of Examples 8-13, including forming multiple levels of floating gate structures for the charge storage transistors, and wherein the forming gate regions of the charge storage transistors includes disposing gate oxide to form control gate regions of the charge storage transistors.

In Example 15, the subject matter of Example 14 includes forming, for a same single access line, contacts to a gate region of a write transistor and a control gate region of a charge storage transistor of a 2T memory cell.

In Example 16, the subject matter of any of Examples 8-15 includes forming contacts for a single vertically extending access line to gate regions of a write transistor and a gate region of a charge storage transistor of a 2T memory cell of a first level of the 2T memory cells, and to gate regions of a write transistor and a charge storage transistor of a 2T memory cell of a second level of the 2T memory cells.

Example 17 is a method of operating a memory array having multiple levels of two-transistor (2T) memory cells vertically arranged, the method comprising: applying, during a write operation, a first write voltage to a target 2T memory cell of a first level of the memory array using a single vertically extending access line; and applying, during a read operation, a first read voltage to the target 2T memory cell using the same single vertically extending access line used in the write operation; wherein the same single vertically extending access line contacts the target 2T memory cell and contacts a first non-target 2T memory cell of a second level of the memory array.

In Example 18, the subject matter of Example 17, including: applying, during the write operation, a second write voltage to both bit lines of a single bit line pair of the target 2T memory cell, wherein the first write voltage and the second write voltage are greater than zero volts; and applying zero volts to both bit lines of a single bit line pair of the non-target 2T memory cell.

In Example 19, the subject matter of Example 18, including: applying, during the read operation, a second read voltage to a single bit line of the single bit line pair of the target 2T memory cell, wherein the second read voltage is greater than zero volts; and applying zero volts to the other bit line of the single bit line pair of the target 2T memory cell and both bit lines of the single bit line pair of the non-target 2T memory cell during the read operation.

In Example 20, the subject matter of any of Examples 18-19, including applying, during the write operation and the read operation, an isolation voltage to unselected access lines of the memory array, wherein the isolation voltage is less than zero volts.

In Example 21, the methods of any one or any combination of Examples 8-15 may be performed to form a structure in accordance with one or any combination of Examples 1-7.

In Example 22, the method of operating a memory array of one or any combination of Examples 17-20 may be performed using the apparatus of one or any combination of Examples 1-7.

In Example 23, the subject matter of one or any combination of Examples 1-15 optionally includes a charge storage transistor that includes a charge trap storage structure.

In Example 24, the multiple levels of two-transistor (2T) memory cells of one or any combination of Examples 1-22 optionally includes multiple vertically arranged tiers of memory devices.

These non-limiting Examples can be combined in any permutation or combination.

In the detailed description and the claims, a list of items joined by the term "at least one of" means any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" means only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements. The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
multiple levels of two-transistor (2T) memory cells vertically arranged above a substrate, wherein each 2T memory cell includes:
a charge storage transistor and a write transistor, wherein a source or drain region of the write transistor is directly coupled to a charge storage structure of the charge storage transistor;
a vertically extending access line disposed to gate both the charge storage transistor and the write transistor of 2T memory cells in multiple respective levels of the multiple vertically arranged levels, wherein the vertically extending access line is operable for performing both write operations and read operations of each of the 2T memory cells to which it is coupled; and
a single bit line pair coupled to multiple 2T memory cells in a respective level, and operable for performing both write operations and read operations of each of the 2T memory cells to which it is coupled.

2. The apparatus of claim 1,
wherein the write transistor includes a write channel portion and the charge storage transistor includes a read channel portion separate from the write channel portion, the read channel portion coupled between bit lines of the single bit line pair; and
wherein a threshold voltage of the write channel portion is greater than a threshold voltage of the read channel portion.

3. The apparatus of claim 2, wherein the vertically extending access line overlaps both the write channel portion and the separate read channel portion of each of the 2T memory cells to which it is coupled.

4. The apparatus of claim 2, wherein a bandgap of semiconductor material included in the write channel portion is greater than a bandgap of semiconductor material included in the read channel portion.

5. The apparatus of claim 2,
wherein the read channel portion comprises two channel sides including a first channel portion arranged adjacent to a first surface of the charge storage structure and a second channel portion arranged adjacent to a second surface of the charge storage structure, and
wherein the second surface is on an opposite side of the charge storage structure from the first surface.

6. The apparatus of claim 1, wherein the charge storage transistor of each 2T memory cell is a floating gate transistor and the charge storage structure is a floating gate structure of the floating gate transistor.

7. The apparatus of claim 6, wherein the vertically extending access line gates the floating gate transistors and the write transistors of the 2T memory cells in multiple respective levels of the multiple vertically arranged levels.

8. A method of operating a memory array having multiple levels of two-transistor (2T) memory cells vertically arranged, the method comprising:
  applying, during a write operation, a first write voltage to a target 2T memory cell of a first level of the memory array using a single vertically extending access line; and
  applying, during a read operation, a first read voltage to the target 2T memory cell using the same single vertically extending access line used in the write operation;
  wherein the same single vertically extending access line contacts the target 2T memory cell and contacts a first non-target 2T memory cell of a second level of the memory array.

9. The method of claim 8, including:
  applying, during the write operation, a second write voltage to both hit lines of a single hit line pair of the target 2T memory cell, wherein the first write voltage and the second write voltage are greater than zero volts; and
  applying zero volts to both bid lines of a single bit line pair of the non-target 2T memory cell.

10. The method of claim 9, including:
  applying, during the read operation, a second read voltage to a single bit line of the single bit line pair of the target 2T memory cell, wherein the second read voltage is greater than zero volts; and
  applying zero volts to the other bit line of the single bit line pair of the target 2T memory cell and both bit lines of the single bit line pair of the non-target 2T memory cell during the read operation.

11. The method of claim 9, including applying, during the write operation and the read operation, an isolation voltage to unselected access lines of the memory array, wherein the isolation voltage is less than zero volts.

* * * * *